United States Patent [19]

Taylor et al.

[11] 4,067,056
[45] Jan. 3, 1978

[54] POLING MACHINE FOR CONTINUOUS FILM OF PYROELECTRIC AND/OR PIEZOELECTRIC MATERIAL

[75] Inventors: Allen L. Taylor, Woodbury; William F. Sheffield, Oakdale, both of Minn.

[73] Assignee: Minnesota Mining and Manufacturing Company, St. Paul, Minn.

[21] Appl. No.: 728,513

[22] Filed: Oct. 1, 1976

Related U.S. Application Data

[63] Continuation-in-part of Ser. No. 479,663, June 17, 1974, abandoned.

[51] Int. Cl.² ............................................. H01G 7/02
[52] U.S. Cl. .................................................. 361/233
[58] Field of Search ........................................ 361/233

[56] References Cited

U.S. PATENT DOCUMENTS

| 2,740,184 | 4/1956 | Thomas | 361/233 X |
| 3,571,679 | 3/1971 | Van Turnhout | 361/233 |
| 3,885,301 | 5/1975 | Murayama | 361/233 X |

Primary Examiner—Harry E. Moose, Jr.
Attorney, Agent, or Firm—Cruzan Alexander; Donald M. Sell; Walter N. Kirn

[57] ABSTRACT

An apparatus and method for continuously poling a film of material exhibiting pyroelectric and/or piezoelectric characteristics are disclosed. The apparatus includes a drive for advancing the film, a hot poling roller, a cold fixing roller, and a pair of electrodes that establish an electric field across the film while it is heated by the hot roller. In a first embodiment, one side of the film is coated with a conductive layer that is electrically grounded to serve as a ground electrode and the poling roller serves as a high voltage electrode for establishing the electrical field across the film. In a second embodiment, the poling roller is electrically grounded and a plurality of corona charging devices are employed as the high voltage electrode. In both embodiments, the poling roller is separated from direct physical contact with the film by a resistive layer in order to avoid serious damage to the film due to electrical arcing that can occur through a defective or thinner than normal area of the film.

8 Claims, 4 Drawing Figures

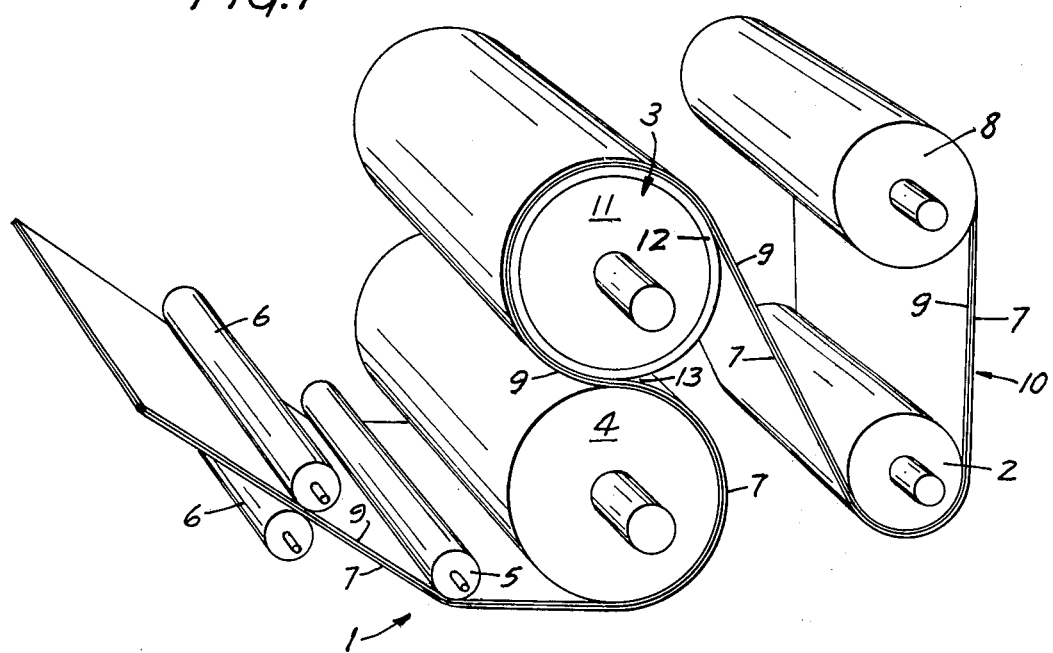
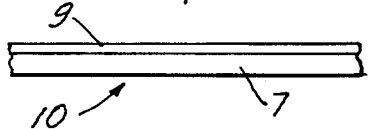
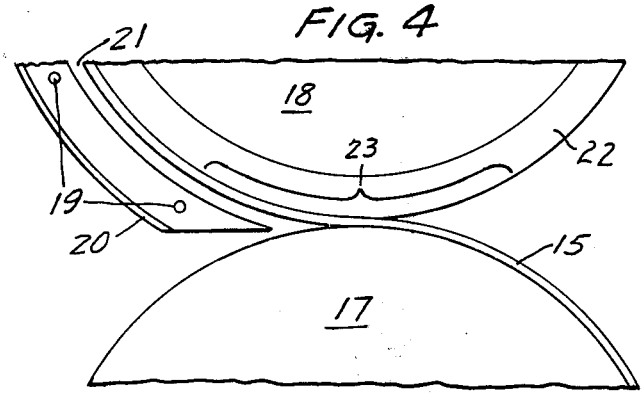
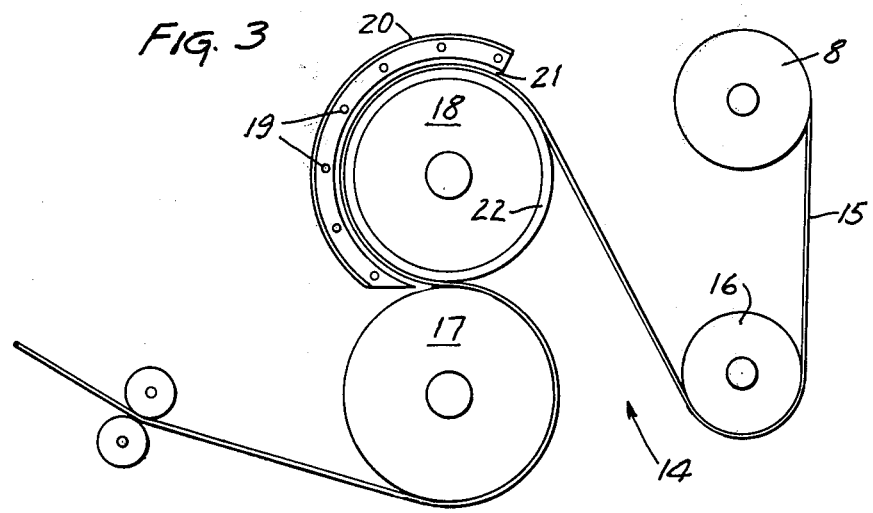

POLING MACHINE FOR CONTINUOUS FILM OF PYROELECTRIC AND/OR PIEZOELECTRIC MATERIAL

RELATED APPLICATIONS

This application is a continuation-in-part of application Ser. No. 479,663, filed June 17, 1974, now abandoned.

BACKGROUND OF THE INVENTION

1. Field of the Invention

The present invention relates in general to the semipermanent poling of materials that exhibit pyroelectric and/or piezoelectric properties, and more specifically relates to the continuous poling of such materials.

2. Description of the Prior Art

Only recently has it been known that certain polymer materials that may be extruded in a continuous film possess pyroelectric and/or piezoelectric properties. Prior to this discovery, crystalline materials were known to exhibit such properties, but forming a continuous layer of material possessing both properties was not possible due to the physical nature of crystalline material. Accordingly, prior art poling techniques are directed to the poling of relatively small segments of material.

A standard technique for poling only a segment of material is to electrically contact both sides of the segment with conductive layers that serve as poling electrodes to which a poling potential is applied for establishing an electric field across the segment. However, this technique has proven unsatisfactory for continuous lengths of material because if the electric field exceeds the breakdown strength of the material, as often happens at a defect or thinner than normal area, a short will occur between the two conductive layers. Such shorting may rupture the material and require shut-down of the poling operation.

Another known poling technique is disclosed in U.S. Pat. No. 3,761,746, wherein a segment of ferroelectric material is positioned inside a sealed chamber and has its planar surfaces exposed to ionized regions that provide a sufficient electric field to produce poling of the segment. Although this procedure apparently performs satisfactorily in poling a single segment of material, the requirement of a sealed chamber in which poling is performed would involve undue complexity for use in poling of a continuous sheet of material.

SUMMARY OF THE INVENTION

The present invention provides an apparatus for continuously poling a film of pyroelectric and/or piezoelectric material. The poling apparatus includes a film advancing drive means, a first means for applying a first voltage potential on one side of a heated portion of the film, a second means that is spaced from the opposite side of the heated portion of the film and is employed to apply a second voltage potential to such opposite side for establishing an electrical field that arranges the dipoles of the heated film portion in alignment.

The film portion is heated above the poling temperature by either the first or second means, and a current limiting layer is interposed between the second means and the opposite side of the heated portion of the film to limit the damage due to arcing that may occur through the film. The poling apparatus also has a fixing means for cooling the heated film portion below its poling temperature while or immediately after the film dipoles are held in alignment.

In a first preferred embodiment the pyroelectric and/or piezoelectric film is coated by conventional means on one side with a conductive layer that is maintained in contact with an electrically grounded roller in order that the conductive layer serves as a first means that applies a ground potential on such one side of the film. The second means of this embodiment is employed to heat the film and apply a second voltage potential to the film, and is formed of a cylindrical roller that has its cylindrical surface coated with a current limiting layer about which the pyroelectric and/or piezoelectric film is guided. The electrical resistance of the current limiting layer is low in comparison to the per unit surface-to-surface resistance of the film and, therefore, the layer does not noticeably affect poling during normal poling operation. However, when an electrical short develops across the film, the current limiting layer represents a high resistance that effectively impedes such shorting and substantially reduces damage to the film.

In a second preferred embodiment the second means is employed to heat the film and apply the second voltage potential to the film, and is formed by a grounded cylindrical roller that has its cylindrical surface coated with a current limiting layer about which the pyroelectric and/or piezoelectric film is guided. The first means of this embodiment for applying the first voltage potential is formed of a plurality of corona charging units spaced from the one side of the film.

The foregoing and other advantages of the present invention will appear from the following description. In the description reference is made to the accompanying drawings, which form a part hereof, and in which there is shown by way of illustration, and not of limitation, specific forms in which the invention may be embodied. Such embodiments do not represent the full scope of the invention, but rather the invention may be employed in a variety of embodiments and reference is made to the claims herein for interpreting the breadth of the invention.

BRIEF DESCRIPTION OF THE DRAWINGS

FIG. 1 is a perspective view of a first embodiment of the poling machine of the present invention through which a film of pyroelectric and/or piezoelectric material is disposed;

FIG. 2 is an enlarged fragmentary view of the film of FIG. 1;

FIG. 3 is a diagrammatic side view in elevation of a second embodiment of the present invention together with a pyroelectric and/or piezoelectric film; and FIG. 4 is a fragmentary diagrammatic view of the poling machine of FIG. 3.

DESCRIPTION OF THE PREFERRED EMBODIMENTS

Although a few materials possessing pyroelectric and/or piezoelectric properties have internal dipoles that are naturally aligned in a poled relatiionship, normally the dipoles of most pyroelectric and/or piezoelectric materials are essentially arranged in random fashion. However, randomly arranged dipoles can be rearranged in orientation when a pyroelectric and/or piezoelectric material is heated above a particular temperature, known as the poling temperature. Above the poling temperature, the dipoles of material will orient themselves in accordance with an applied electric field.

The degree of dipole orientation is a function of the temperature to which the material is heated, the applied field strength and length of time the field is applied. For example, substantial poling begins in polyvinylidene fluoride when it is heated to a temperature greater than 90° C and an electric field of at least 4,000 volts per millimeter of thickness is applied. Increasing the temperature and/or the applied electric field will progressively increase the degree of poling achieved up to a maximum.

Once a pyroelectric and/or piezoelectric material is poled and then cooled below its poling temperature, the applied field may be removed and the dipoles will remain substantially as oriented by the applied field. However, if the poled material is heated above its poling temperature for an extended period thereafter, the dipoles will return to random orientation.

The present invention is adapted to provide continuous poling of a film of noncrystalline type material such as, but not limited to polyvinylidene fluoride and polyvinyl fluoride. Referring now to FIG. 1 of the drawings, a first embodiment of the present invention is shown in the form of a poling machine 1 that includes a preheat roller 2, a hot poling roller 3, a cold fixing roller 4, an electrically grounded roller 5, and a pair of drive rollers 6, all of which rollers are cylindrical in shape and are mounted from side plates (not shown) of the machine 1.

The poling machine 1 is adapted to be employed for poling a film 7 of pyroelectric and/or piezoelectric material that is highly insulative electrically but, as indicated most clearly in FIG. 2 is coated on one side with a relatively thin layer 9 of electrically and thermally conductive material such as aluminum, zinc, copper, etc. to form a composite sheet 10. Referring back to FIG. 1, the composite sheet 10 is supplied to the machine 1 from a supply roll 8 and is threaded partially around the rollers 2, 3, 4 and 5, and then through a nip between the two drive rollers 6 that serve to advance the sheet 10 through the machine 1. A portion of the conductive layer 9 of the sheet 10 is always in physical contact with the grounded roller 5 in order that the layer 9 acts as a first means for applying a ground potential to the side of the film coated by the layer 9. Thus, the entire planar surface of the side of the film 7 coated by the layer 9 is electrically grounded.

To more fully understand the operation of the present invention and the manner in which the film 7 is poled, the following description is made with regard to a reference portion of the composite sheet 10 as such portion of the sheet 10 is advanced through the machine 1. Upon leaving the supply roll 8 the reference portion of the sheet 10 first partially winds around the preheat roller 2 such that the conductive layer 9 contacts the roller 2. The preheat roller 2 is heated, either electrically or in some other manner, to a temperature preferably over 100° C. The roller 2 is not essential to the poling operation of the machine 1, but is employed for eliminating wrinkles in the sheet 10 thereby insuring optimum uniform poling of the film 7. To further aid in controlling wrinkles in the sheet 10, a drag brake (not shown) may be used with the supply roll 8 in order that the sheet 10 is subjected to a predetermined desired tension.

Subsequent to leaving contact with the roller 2, the reference portion of the sheet 10 is guided to the poling roller 3 whereby the pyroelectric and/or piezoelectric film 7 of the sheet 10 engages the outer cylindrical surface thereof. The roller 3 includes an electrically conductive inner core 11 that is biased at a high d-c voltage potential and is heated, in a manner similar to that used to heat the roller 2, to a sufficient temperature to obtain optimum poling of the film 7. However, the film is not heated to such temperature that it loses substantial tensile strength. Thus, the inner core 11 serves as a second means that coacts with the grounded layer 9 to establish an electrical field across the sheet 10 for producing alignment of the dipoles of the film 7 included in the reference portion of the sheet 10. It is not essential that the layer 9 be at ground potential to establish such an electric field across the sheet 10. All that is required for proper poling operation is that the layer 9 be at a sufficiently different potential from that of the core 11.

The employment of the inner core 11 as a voltage potential means is highly advantageous because it substitutes for a conductive layer coating such as the layer 9 and also because it reduces the potential of serious damage to the film 7 should an arc develop between the conductive layer 9 and the inner core 11. Such arcing generally results because of a defect or an area in the film 7 that is thinner than normal. Arcing between the layer 9 and the core 11 dissipates the stored up energy therebetween, which energy is stored in a direct proportion to the surface area of the core 11 and is considerably less than the energy that would be stored if the core 11 was replaced with a conductive coating on the side of the film 7 opposite the conductive layer 9.

To further aid in reducing the potential of damage of the film 7 by arcing, the cylindrical surface of the inner core 11 is overlaid with a current limiting layer 12 on which the film 7 rides as it advances around the periphery of the roller 3. The layer 12 preferably is formed from elastomeric materials such as silicone rubber, but ceramic materials may also be employed. The layer 12 is employed to provide current limiting protection between the highly charged inner core 11 of the roller 3 and the grounded layer 9 of the pyroelectric and/or piezoelectric film. Thus, if arcing occurs through the film 7, the layer 12 will represent a resistance to such arcing. The value of the resistance of the layer 12 is substantially less than the value of the resistance presented by the film 7 so that during normal poling operation the layer 12 has substantially no effect. However, the resistance of the layer 12 significantly aids in reducing damage to the film 7 due to electrical shorting through the film.

If the layer 12 is not employed and an electrical discharge occurs through the film 7, such discharge would be substantially instantaneous and would be similar to the shorting together of two charged plates of a capacitor. With the resistance of the elastomeric layer 12 between the core 11 and the layer 9, the rate of discharge through the film 7 will be determined by the time constant RC, wherein R represents the resistance of layer 12 and C equals the capacitance that existed between the layer 9 and the core 11 before the discharge developed.

When the reference portion of the sheet 10 approaches the end of its travel around the roller 3, it passes through a narrow nip 13 defined by the space between the poling roller 3 and the cold roller 4, which is preferably water cooled. The cold roller 4 is spring biased toward the hot roller 3 so that the size of the nip 13 is determined by the thickness of the sheet 10. As a result, the conductive coated layer 9 of the reference portion of the sheet 10 contacts the cold roller 4 while the opposite surface of the film 7 is still in contact with the hot roller 3. Preferably, the roller 4 is sufficiently cold to rapidly lower the temperature of the film 7 coming in contact with it to a point below the poling temperature of the film 7 prior to disengagement of the reference portion of the film 7 from the roller 3 or immediately thereafter. Accordingly, when the reference portion of the sheet 10 leaves the roller 3, the dipoles of the film 7 remain as oriented by the electric field and the poled reference portion of the film 7 thereupon passes by the ground roller 5, through the drive rollers 6 and out the machine 1 to a take up roller (not shown).

Thus, the present invention provides a relatively simplistic means for poling a continuous film of pyroelectric and/or piezoelectric material in a manner that significantly eliminates serious damage to the material as a result of arcing therethrough. Although the use of a coated conductive layer on the material is employed with the machine 1, such conductive layer is not essential to the present invention as indicated by a second embodiment of the present invention represented by a poling machine 14, diagrammatically shown in FIG. 3.

The poling machine 14 is adapted to continuously pole a film 15 of pyroelectric and/or piezoelectric material that has no conductive coating on either surface. The machine 14 includes a preheat roller 16, a cold fixing roller 17 and a hot poling roller 18, each of which is similar to the respective corresponding rollers 2, 4 and 11. The roller 18, like the roller 11, is formed of an electrically conductive material to provide the second voltage potential means, is heated for raising the temperature of the film 15 above the poling temperatue and carries a current limiting layer 22, similar to the layer 12 of the machine 1, thereon. However, the machine 14 differs from the machine 1 in that the roller 18 is electrically grounded. To provide a first means to apply a high voltage to coact with the grounded roller 18 for establishing an electric field across the film 15, a plurality of d-c corona charging units 19 are mounted in a bracket assembly 20. The units 19 are disposed in a spaced relationship from one another and are circumferentially spaced from the film 15 as it is advanced around the roller 18. It is not essential that the roller 18 be at ground potential, but the roller 18 must differ in potential from that of the units 19 to establish an appropriate electric field therebetween.

The operation of the machine 14 resembles that of the machine 1 in that the film 15 is heated by contacting the layer 22 on the roller 18, and is then subjected to an electrical field provided by the corona charging units 19 and the grounded roller 18. Because of physical limitations due to the use of the charging units 19, the film 15 is removed from the electric field provided by the charging units 19 and the grounded roller 18 before the film 15 contacts the cold roller 17. To cool the film 15 below its poling temperature before leaving such electric field or immediately thereafter, the cold roller 17 is colled to a sufficiently low temperature that, as indicated in FIG. 4, a portion 23 of the layer 22 directly adjacent the cold roller 17 is also cooled below the poling temperature. Thus, it is the portion 23 that primarily cools the film 15 below the poling temperature before or immediately after the film 15 is advanced out of the electric field provided by the charging units 19 and the roller 18. Therefore, the poling results of the machine 14 are similar to those of the machine 1, although accomplished in a somewhat different fashion.

It is not essential that the cold roller 17 be employed in this embodiment, since the charging units 19 may be extended beyond the roller 18 on one side of film 15 and air blowers may be positioned on the opposite side of the film 15 to cool it below the poling temperature.

The following non-limiting example is now provided.

EXAMPLE I

A 0.05 mm. thick, 305 mm. wide film 7 of polyvinylidene fluoride was vapor coated with a 178 mm. wide layer 9 of aluminum on one side and was then fed to the poling machine 1, shown in FIG. 1. The temperature of the preheat roller 2 was held at approximately 130° C, and the cold roller 5 was water cooled to a temperature of 30° C. The poling roller 3 was 140 mm. in diameter and was coated with a layer 12 of conductive rubber approximately 1.49 mm. thick and having an electrical resistivity approximately equal to $10^{10}$ ohms-cm. The film 7 was driven through the machine 1 at the rate of 31.8 mm. per minute and the rollers 2, 3, 4 and 5 were arranged in such fashion that the rollers 2, 4 and 5 physically contacted only the conductive layer 9 on the film 7, whereas, the poling roller 3 physically contacted only the film 7. The inner core 11 of the roller 3 was heated to a temperature of 120° C and was held at a voltage sufficient to maintain the surface of the film 7 at a voltage level of 5,000 volts to place a potential of $10^6$ volts/cm. across the film. Nearly three-fourths of the circumference of the poling roller 3 contacted the film 7, whereby the film 7 was presented to the poling roller 3 for approximately 10 minutes.

What is claimed is:

1. A poling apparatus for continuously processing a length of film of polymeric material to semipermanently align the dipoles of the film to provide at least one of pyroelectric and piezoelectric properties in the film, which apparatus comprises:
   a drive means for continuously advancing said film past a poling station;
   a first means for applying an electrical potential on at least one side of a portion of said film;
   a second means located at the poling station and spaced from an opposite side of said film for coacting with said first means to establish an electric field greater than 4,000 volts/mm across said portion of said film for aligning the dipoles of said portion to provide at least one of pyroelectric and piezoelectric properties in said portion of said film, one of which of said first and second means provides heat for raising the temperature of at least a segment of said portion of said film above the film poling temperature during at least a portion of the time the alignment of the dipoles of said segment is influenced by said electric field;
   a current limiting layer carried on said second means for contacting said opposite side of said film, the electrical resistance between opposite surfaces of said layer being substantially less than the resistance between opposite surfaces of the film during normal poling operation, and providing current limiting protection when an electrical short occurs between the surfaces of the film; and
   a fixing means for cooling the heated portion of said film below said poling temperature while the dipoles of said portion of said film are substantially held in alignment by the influence of said electric field.

2. A poling apparatus as recited in claim 1 wherein said first means includes a layer of conductive material that is carried on said one side of said film and an electrically grounded roller that contacts said conductive layer to ground said one side of said film.

3. A poling apparatus as recited in claim 2 wherein said second means is a cylindrical roller having a core of an electrically conductive material on which said electrical current limiting layer is carried.

4. A poling apparatus as recited in claim 1 wherein said second means includes an electrically grounded cylindrical roller on which said electrical current limiting layer is carried and about which said polymeric film is partially guided.

5. A poling apparatus as recited in claim 4 wherein said first means includes a plurality of charging means spaced circumferentially from said one side of said film.

6. A poling apparatus as recited in claim 1 wherein said means for providing heat for raising the temperature of said segment above the film poling temperature provides a film temperature that is less than the temperature at which the film loses substantial tensile strength.

7. A process for continuously poling a film of polymeric material to align the dipoles of the film to provide at least one of pyroelectric and piezoelectric properties in the film, which process comprises the steps of:

advancing said film past a poling station that includes a poling electrode having a current limiting layer carried thereon for contacting said film, the electrical resistance between opposite surfaces of said layer being substantially less than the resistance between opposite surfaces of the film during normal poling operation, and providing current limiting portection when an electrical short occurs between the surfaces of the film;

heating said film at said poling station so that at any given time only a portion of said film is heated above the film poling temperature;

applying a first voltage potential to at least one side of the heated portion of said film concurrently with said heating;

applying a second voltage potential to the opposite side of the heated portion of said film concurrently with said heating to establish an electric field greater than 4,000 volts/mm across said portion to align the dipoles of said portion to provide at least one of pyroelectric and piezoelectric properties in said portion; and cooling the heated portion of said film while the dipoles of said portion are substantially in alignment.

8. A process as recited in claim 7 wherein the heating of said film at the poling station provides a film temperature that is less than the temperature at which the film loses substantial tensile strength.

* * * * *